(12) United States Patent
Lee et al.

(10) Patent No.: US 11,569,121 B2
(45) Date of Patent: Jan. 31, 2023

(54) METHODS FOR FORMING SEMICONDUCTOR DEVICES

(71) Applicant: Vanguard International Semiconductor Corporation, Hsinchu (TW)

(72) Inventors: I-Ping Lee, Hsinchu (TW); Kwang-Ming Lin, Taichung (TW); Chih-Cherng Liao, Zhudong Township (TW); Ya-Huei Kuo, Hsinchu (TW); Pei-Yu Chang, Zhubei (TW); Ya-Ting Chang, Hsinchu (TW); Tsung-Hsiung Lee, Taoyuan (TW); Zheng-Xian Wu, Taoyuan (TW); Kai-Chuan Kan, Hsinchu (TW); Yu-Jui Chang, Hsinchu (TW); Yow-Shiuan Liu, Taipei (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 17/331,018

(22) Filed: May 26, 2021

(65) Prior Publication Data
US 2022/0384251 A1    Dec. 1, 2022

(51) Int. Cl.
*H01L 21/762*    (2006.01)

(52) U.S. Cl.
CPC ............... *H01L 21/76232* (2013.01)

(58) Field of Classification Search
CPC ......... H01L 21/76232; H01L 21/76224; H01L 21/76235; H01L 21/30604; H01L 21/764; H01L 21/3212; H01L 21/3065
See application file for complete search history.

(56) References Cited

U.S. PATENT DOCUMENTS

| | | | |
|---|---|---|---|
| 6,251,783 B1 | 6/2001 | Yew et al. | |
| 9,105,687 B1 * | 8/2015 | Dubois | H01L 21/764 |
| 2017/0076976 A1 * | 3/2017 | Yeh | H01L 21/76232 |

FOREIGN PATENT DOCUMENTS

| | | |
|---|---|---|
| CN | 101051601 A | 10/2007 |
| CN | 105006447 A | 10/2015 |

OTHER PUBLICATIONS

Taiwanese Office Action and Search Report for Taiwanese Application No. 110109969, dated Apr. 29, 2022.

* cited by examiner

*Primary Examiner* — Julia Slutsker
(74) *Attorney, Agent, or Firm* — Birch, Stewart, Kolasch & Birch, LLP (57) ABSTRACT

Methods of forming semiconductor devices are provided. The methods include: forming a trench in a substrate, wherein the trench includes a defect protruding from a bottom surface of the trench; forming a flowable material on the substrate to at least partially cover the defect; performing an etching process to reduce the height of the defect; and removing the flowable material.

20 Claims, 10 Drawing Sheets

METHODS FOR FORMING SEMICONDUCTOR DEVICES

BACKGROUND

Technical Field

The disclosure relates to methods for forming semiconductor devices, and more particularly to methods for forming trench isolation structures.

Description of the Related Art

In semiconductor devices, isolation structures are generally used to separate semiconductor components such as transistors, resistors and capacitors in an active region from semiconductor components in an adjacent active region on the same semiconductor substrate.

The isolation structures that are currently in use include trench isolation structures. A trench is formed in the substrate according to the pattern of the isolation region, and the trench is subsequently filled with an isolation dielectric to form the trench isolation structure to electrically isolate the adjacent active regions of the semiconductor device from each other. However, defects in the trench may cause an electrical breakdown between the substrate and the active region above the trench isolation region, which can be particularly dangerous during high-voltage operation. Therefore, there is a need for a method to reduce trench defects.

SUMMARY

Some embodiments of the present disclosure provide a method, comprising: forming a trench in a substrate, wherein the trench comprises a defect protruding from a bottom surface of the trench; forming a flowable material on the substrate to at least partially cover the defect; performing an etching process to reduce the height of the defect; and removing the flowable material.

In some embodiments, forming the trench comprises: forming a pad layer on the substrate; and etching the pad layer and the substrate to form the trench.

In some embodiments, the pad layer comprises an oxide, a nitride or a combination thereof.

In some embodiments, a top surface of the flowable material in the trench is lower than a top surface of the pad layer.

In some embodiments, a top surface of the flowable material in the trench is level with a top surface of the pad layer.

In some embodiments, the defect comprises a needle defect, a column defect, a cone defect or a combination thereof.

In some embodiments, after the etching process, the height of the defect is between 100 nm and 800 nm.

In some embodiments, the flowable material comprises a photoresist, an anti-reflection coating (ARC), a spin on glass (SOG) or a combination thereof.

In some embodiments, further comprising: forming a mask layer on the flowable material before the etching process; and patterning the mask layer, wherein the patterned mask layer partially covers the flowable material on sidewalls of the trench.

In some embodiments, the etching process comprises a dry etching process, a wet etching process or a combination thereof.

In some embodiments, a thickness of the flowable material in the trench is greater than a thickness of the flowable material outside the trench.

In some embodiments, performing the etching process comprises: performing a first etching process to remove a portion of the flowable material to expose the defect; and performing a second etching process to reduce the height of the defect.

In some embodiments, the ratio of the etching rate of the flowable material to the etching rate of the defect is between 3:1 and 100:1 in the first etching process.

In some embodiments, the ratio of the etching rate of the flowable material to the etching rate of the defect is between 1:3 and 1:100 in the second etching process.

In some embodiments, reducing the height of the defect and removing the flowable material are performed in the same etching process.

In some embodiments, the ratio of the etching rate of the flowable material to the etching rate of the defect is 1:1 in the etching process.

In some embodiments, performing the etching process comprises: performing a first etching process to remove a portion of the flowable material and reduce the height of the defect; and performing a second etching process to further reduce the height of the defect.

In some embodiments, the ratio of the etching rate of the flowable material to the etching rate of the defect is between 3:1 and 100:1 in the first etching process.

In some embodiments, the ratio of the etching rate of the flowable material to the etching rate of the defect is between 1:3 and 1:100 in the second etching process.

In some embodiments, the etching process only reduces the height of the defect without removing the flowable material, and wherein the ratio of the etching rate of the flowable material to the etching rate of the defect is between 1:3 and 1:100 in the etching process.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first layer disposed on a second layer", may indicate not only the direct contact of the first layer and the second layer, but also a non-contact state with one or more intermediate layers between the first layer and the second layer. In the above situation, the first layer may not directly contact the second layer.

In addition, the present disclosure may repeat reference numerals and/or letters in the various examples. This repetition is for the purpose of simplicity and clarity and does not in itself dictate a relationship between the various embodiments and/or configurations discussed. Some variations of embodiments are described below. In different figures and illustrated embodiments, similar element symbols are used to indicate similar elements.

The drawings provided are only schematic diagrams and are non-limiting. In the drawings, the size, shape, or thickness of some of the elements may be exaggerated and not drawn to scale, for illustrative purposes. The dimensions and the relative dimensions do not correspond to actual location in the practice of the disclosure. The disclosure will be described with respect to particular embodiments and with reference to certain drawings, but the disclosure is not limited thereto.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The use of ordinal terms such as "first", "second", "third", etc., in the disclosure to modify an element does not by itself connote any priority, precedence, or order of one claim element over another or the temporal order in which it is formed, but are used merely as labels to distinguish one claim element having a certain name from another element having the same name (but for use of the ordinal term) to distinguish the claim elements.

The term "substantially" in the description, such as in "substantially the same" will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%.

During formation of a trench structure of a semiconductor device, a defect protruding upward from a bottom surface of the trench may be simultaneously formed. The upwardly protruding defect significantly reduces a distance between an active region and a trench isolation region of the semiconductor device, which may cause electrical breakdown between the active region and the trench isolation region, thereby resulting in failure. Some embodiments of the present disclosure provide methods for forming semiconductor devices, including forming a flowable material on a trench defect, and reducing the height of the defect by using various ratios of etching rates of the flowable material to etching rates of the defect, thereby improving the failure rate of the semiconductor devices.

In the present disclosure, the term "defect" includes a needle defect, a column defect, a cone defect or a combination thereof. In the drawings, the "needle defect" is taken as an example for description. However, the present disclosure is not limited thereto.

Figure 1A:
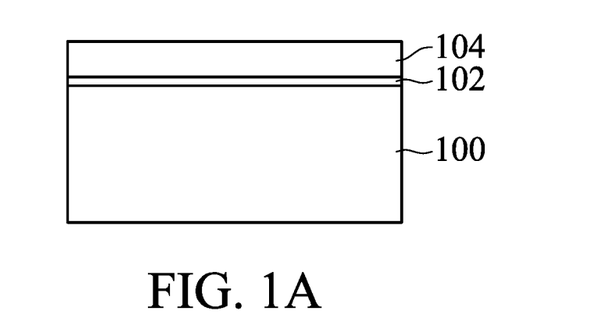
FIGS. 1A-1C are cross-sectional views of a trench including a needle defect at various fabrication stages according to some embodiments of the present disclosure.
Figure 1B:
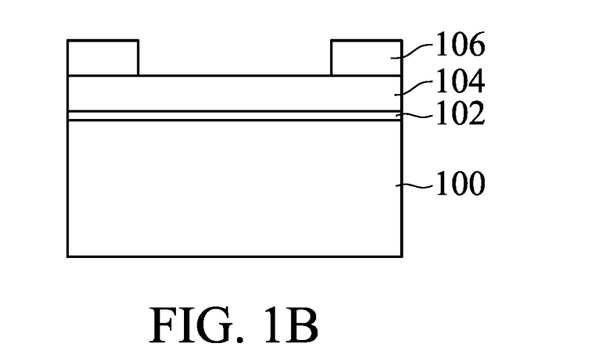
Figure 1C:
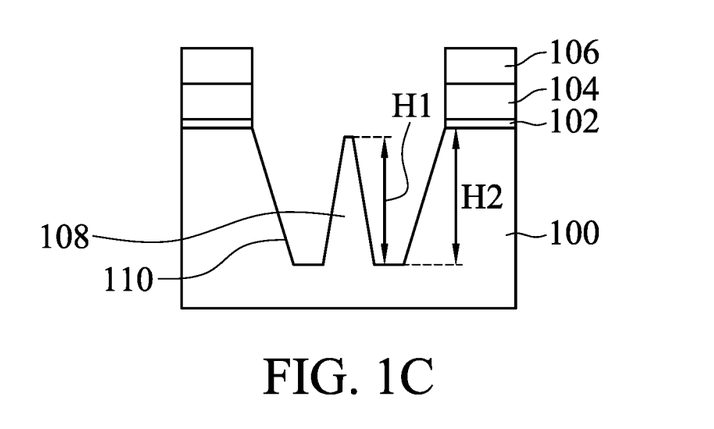

FIGS. 1A-1C are cross-sectional views of a trench including a needle defect at various fabrication stages according to some embodiments of the present disclosure. Referring to FIG. 1A, pad layers 102 and 104 are formed on a semiconductor substrate 100. In some embodiments, the semiconductor substrate 100 may be formed of silicon or other semiconductor materials. Alternatively or additionally, the semiconductor substrate 100 may include other elementary semiconductor materials, such as germanium. In some embodiments, the semiconductor substrate 100 may be formed of a compound semiconductor, such as silicon carbide, gallium arsenide, gallium phosphide, indium phosphide, indium arsenide, and/or indium antimonide. In some embodiments, the semiconductor substrate 100 may be formed of an alloy semiconductor, such as SiGe, GaAsP, AlInAs, AlGaAs, InGaAs, GaInP, and/or GaInAsP. In some embodiments, the semiconductor substrate 100 may include a semiconductor-on-insulator substrate, such as Si-on-insulator (SOI) substrate, SiGe-on-insulator (SGOI) substrate or Ge-on-insulator (GOI) substrate.

The pad layers 102 and 104 include oxides, nitrides or combinations thereof. In some embodiments, the pad layers include the pad oxide 102 on the semiconductor substrate 100 and the pad nitride 104 on the pad oxide 102. In some embodiments, the pad oxide 102 may be formed by thermally oxidizing the semiconductor substrate 100 and the pad nitride 104 may be formed on the pad oxide 102 through chemical vapor deposition (CVD) or other deposition techniques.

Referring to FIG. 1B, after the formation of the pad layers 102 and 104, a photoresist layer 106 may be formed on the pad nitride 104 through, for example, spin coating, and may be patterned through a lithography process. After patterning the photoresist layer 106, an isolation region where a trench may be formed therein is exposed.

Referring to FIG. 1C, a trench 110 is defined through the patterned photoresist layer. In some embodiments, the trench 110 may be formed in the semiconductor substrate 100 through a dry etching process using the patterned photoresist layer 106 as an etching mask. During the formation of the trench 110 of the semiconductor device, an etchant may be blocked by fine particles existing on the surface of the semiconductor substrate 100, which results in a formation of a needle defect 108 under the particles, as shown in FIG. 1C. In some embodiments, the needle defect 108 protrudes upward from the bottom surface of the trench 110. In other embodiments, more needle defects 108 with different heights may be formed.

Still referring to FIG. 1C, in some embodiments, the height H1 of the needle defect 108 is substantially the same as the height H2 of the trench in the semiconductor substrate 100, for example, between about 100 nm and about 800 nm. In other embodiments, the needle defect 108 may have a different height.

Figure 2A:
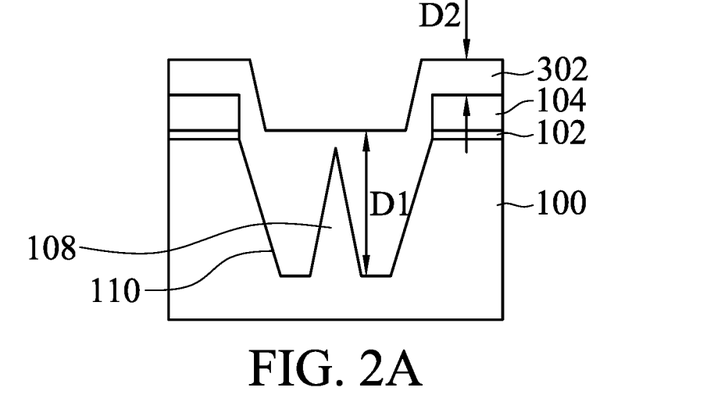
FIGS. 2A-2H are cross-sectional views of a semiconductor device at various stages of processes for reducing the needle defect according to some embodiments of the present disclosure.

FIGS. 2A-2H are cross-sectional views of the semiconductor device at various stages of processes for reducing the needle defect according to some embodiments of the present disclosure. The step shown in FIG. 2A follows the process described in FIG. 1C. Referring to FIG. 2A, after the formation of the trench 110 with the needle defect 108, a flowable material 302 is formed on the substrate 100 to completely cover the needle defect 108. In some embodiments, as shown in FIG. 2A, the top surface of the flowable material 302 in the trench 110 is substantially level with the top surface of the pad layer 102.

Due to the characteristics of the flowable material 302, it can not only be conformally formed on the needle defect 108, but can be formed in a trench to completely or partially cover the needle defect 108. As shown in FIG. 2A, the thickness D1 of the flowable material 302 in the trench 110 is greater than the thickness D2 of the flowable material 302 outside the trench 110. The flowable material can cover the defect in the trench, thereby having a thinner flowable material above the defect. As long as the thinner flowable material above the defect is removed to at least partially expose the defect, the height of the defect can be further reduced through etching selectivity between the flowable material and the defect. In some embodiments, the thickness D1 of the flowable material 302 in the trench is between about 50 nm and about 800 nm, and the thickness D2 of the flowable material 302 outside the trench is between about 0 nm and about 800 nm.

In some embodiments, the flowable material 302 may include a photoresist, an anti-reflection coating (ARC), a spin on glass (SOG) or a combination thereof. The flowable material 302 may be formed on the substrate 100 through a coating process, such as spin coating.

Figure 2B:
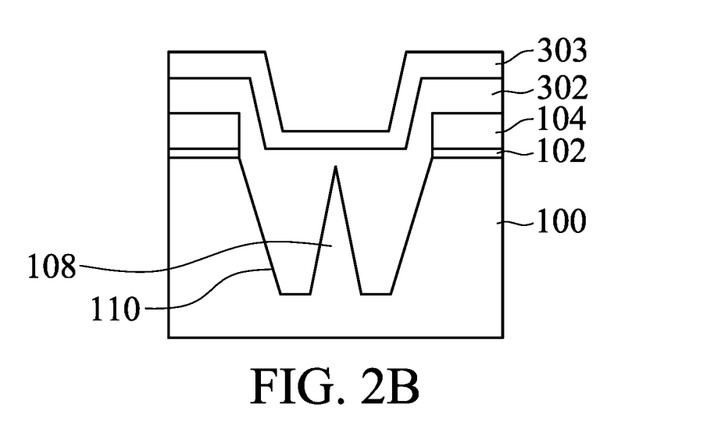

Referring to FIG. 2B, a mask layer 303 is formed on the flowable material 302. The mask layer 303 may be a photoresist, such as a positive photoresist or a negative photoresist. In some embodiments, the mask layer 303 may be a hard mask, such as silicon oxide, silicon nitride, silicon oxynitride, silicon carbide, silicon carbide nitride, or a combination thereof. In some embodiments, the mask layer 303 may be formed through spin coating, physical vapor deposition (PVD), chemical vapor deposition (CVD), other suitable processes, or a combination thereof.

Figure 2C:
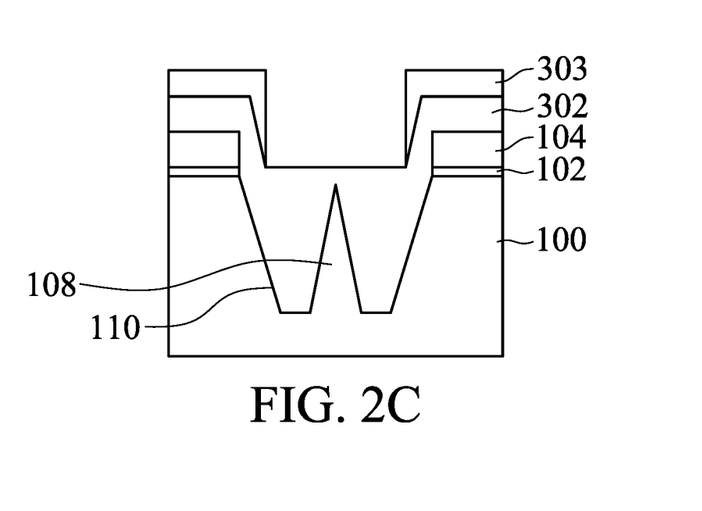

Referring to FIG. 2C, the mask layer 303 is patterned to remove a portion of the mask layer 303 above the needle defect 108. The patterning process may include a photolithography process (for example, photoresist coating, soft baking, mask alignment, exposure, post-exposure baking, development, other suitable processes or a combination thereof), an etching process (for example, a wet etching process, a dry etching process, other suitable processes or a combination thereof), other suitable processes or a combination thereof. In the embodiment shown in FIG. 2C, the patterned mask layer 303 partially covers the flowable material 302 on the sidewalls of the trench, while exposing the flowable material 302 above the needle defect 108.

Figure 2D:
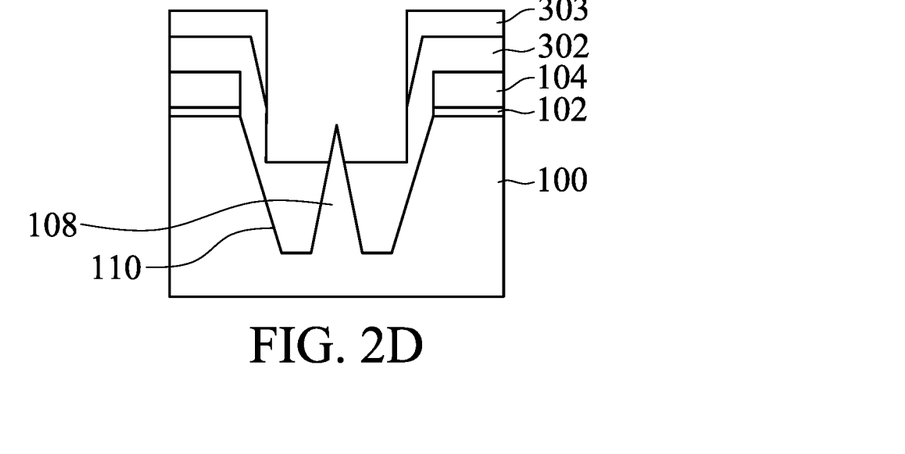

Referring to FIG. 2D, a first etching process is performed to remove a portion of the flowable material 302 to expose the needle defect 108 using the patterned mask layer 303 as an etching mask. In an embodiment, the needle defect 108 may include silicon, and the flowable material 302 may include photoresist, ARC, SOG, or a combination thereof, and a dry etching process, a wet etching process, or a combination thereof may be used as the first etching process. The etchant for the dry etching process may include, for example: chlorine-containing gas (such as $Cl_2$, $SiCl_4$ and/or $BCl_3$), bromine-containing gas (such as HBr), fluorine-containing gas (such as $CF_4$, $SF_6$, $CH_2F_2$, $CHF_3$, $NF_3$ and/or $C_2F_6$), nitrogen-containing gas (such as $N_2$), hydrogen-containing gas (such as $H_2$), oxygen-containing gas (such as $O_2$, $CO_2$, COS), or a combination thereof. The etchant for the wet etching process may include, for example, ammonium hydroxide ($NH_4OH$), hydrofluoric acid (HF), deionized water, tetramethylammonium hydroxide (TMAH), or a combination thereof.

In the first etching process, the ratio of the etching rate of the flowable material to the etching rate of the defect may be between 3:1 and 100:1, or higher in other embodiments. With the high etching selectivity between the flowable material 302 and the needle defect 108, a portion of the flowable material 302 may be removed without etching the needle defect 108.

Figure 2E:
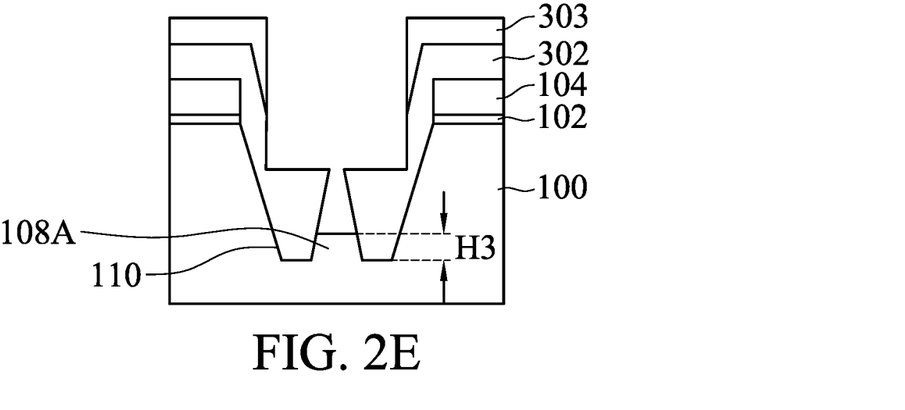

Referring to FIG. 2E, a second etching process is performed to reduce the height of the needle defect 108. In an embodiment, the needle defect 108 may include silicon, and the flowable material 302 may include photoresist, ARC, SOG, or a combination thereof, and a dry etching process, a wet etching process, or a combination thereof may be used as the second etching process. The etchant for the dry etching process may include, for example: chlorine-containing gas (such as $Cl_2$, $SiCl_4$ and/or $BCl_3$), bromine-containing gas (such as HBr), fluorine-containing gas (such as $CF_4$, $SF_6$, $CH_2F_2$, $CHF_3$, $NF_3$ and/or $C_2F_6$), nitrogen-containing gas (such as $N_2$), hydrogen-containing gas (such as $H_2$), oxygen-containing gas (such as $O_2$, $CO_2$, COS), or a combination thereof. The etchant for the wet etching process may include, for example, ammonium hydroxide ($NH_4OH$), hydrofluoric acid (HF), deionized water, tetramethylammonium hydroxide (TMAH), or a combination thereof.

In the second etching process, the ratio of the etching rate of the flowable material to the etching rate of the defect may be between 1:3 and 1:100, or higher in other embodiments. With the high etching selectivity between the flowable material 302 and the needle defect 108, the height of needle defect 108 may be reduced without etching the flowable material 302. After the second etching process, the height H3 of the defect 108A may be between about 0 nm and about 200 nm. The ratio of the height reduction of the needle defect 108 may be defined as: (the height of the needle defect before the etching process—the height of the defect after the etching process)/(the height of the needle defect before the etching process). The ratio of the height reduction of the needle defect 108 may be between about 10% and about 60%. In some embodiments, when the height H3 is reduced to about 150 nm, the failure rate of the device can be significantly improved. However, the present disclosure is not limited thereto. The height of the needle defect 108 may be further reduced to close to zero, thereby further improving the reliability of the device.

Figure 2F:
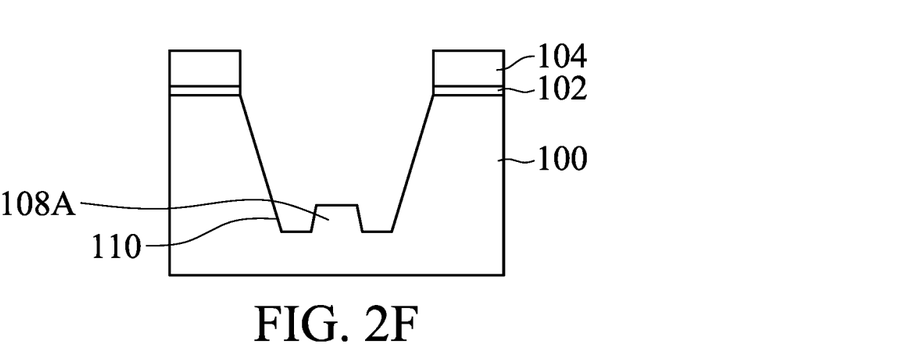

Referring to FIG. 2F, after the etching process, the mask layer 303 and the flowable material 302 may be removed collectively or separately through, for example, an ash process or a wet strip process.

Figure 2G:
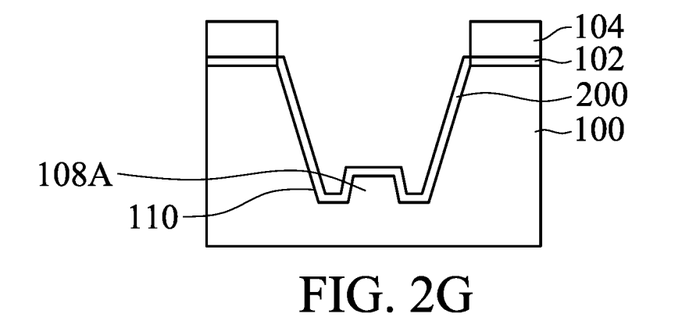

Referring to FIG. 2G, a liner oxide layer 200 is formed on the bottom of the trench 110, the sidewalls of the trench 110, and the defect 108A. In some embodiments, the liner oxide layer 200 may be formed by an oxidation process, such as a thermal oxidation process, a radical oxidation process, or other suitable processes. Subsequently, an annealing process may be performed on the liner oxide layer 200 to increase the density of the liner oxide layer 200. In some embodiments, the annealing process may be a rapid thermal annealing (RTA) process.

It should be understood that the process sequence shown in FIGS. 2A to 2G is merely an example. In some other embodiments (not shown), the liner oxide layer may be formed before the formation of the flowable material. The flowable material is then formed on the liner oxide layer, and the process regarding to reduce the height of the defect is subsequently performed.

Figure 2H:
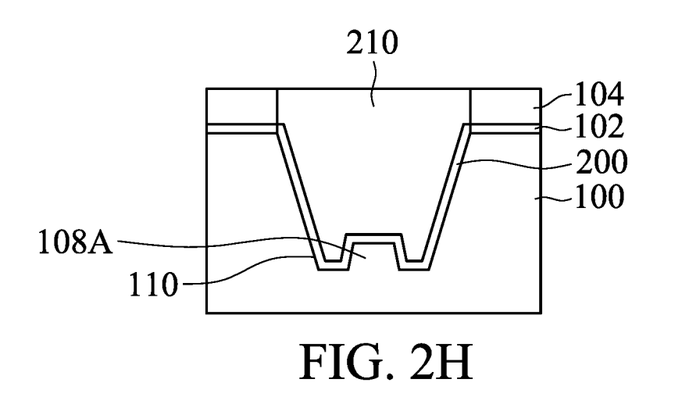

Referring to FIG. 2H, the trench 110 is filled with a dielectric material 210 to complete the fabrication of a shallow trench isolation (STI) structure. In some embodiments, the dielectric material 210 may include oxides, nitrides, carbides, other suitable dielectric materials, or combinations thereof. In some embodiments, the trench 110 may be filled with the dielectric material 210 through a deposition process, such as chemical vapor deposition (CVD), atmospheric pressure chemical vapor deposition (APCVD), high density plasma chemistry (HDPCVD), flowable CVD, other suitable methods or combinations thereof. Subsequently, a chemical mechanical polishing (CMP) process may be used to remove the excess dielectric material 210 so that the top surface of the dielectric material 210 is level with the top surface of the pad layer 104.

Through the method of the embodiment shown in FIGS. 2A-2H, the height of the trench defect of the semiconductor device can be reduced to avoid undesired electrical breakdown, thereby reducing the failure rate of the device. Furthermore, the flowable material can cover the defect in the trench, thereby having the thinner flowable material above the defect. As long as the thinner flowable material above the defect is removed to at least partially expose the defect, the height of the defect can be further reduced through etching selectivity between the flowable material and the defect.

Figure 3A:
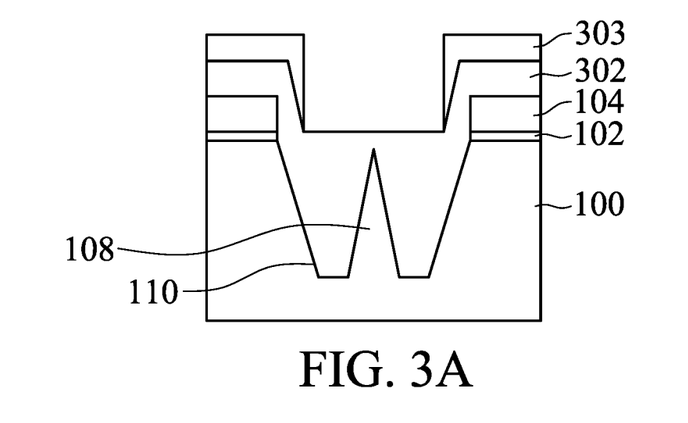
FIGS. 3A-3C are cross-sectional views of a semiconductor device at various stages of processes for reducing the needle defect according to other embodiments of the present disclosure.
Figure 3B:
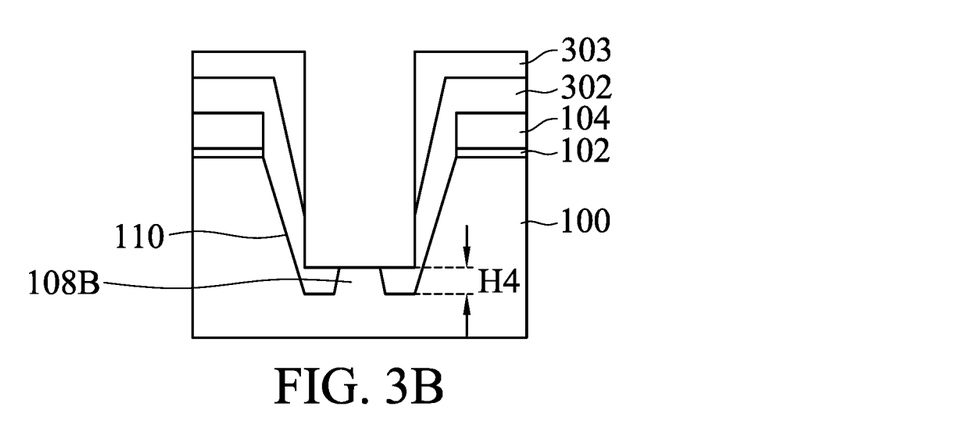
Figure 3C:
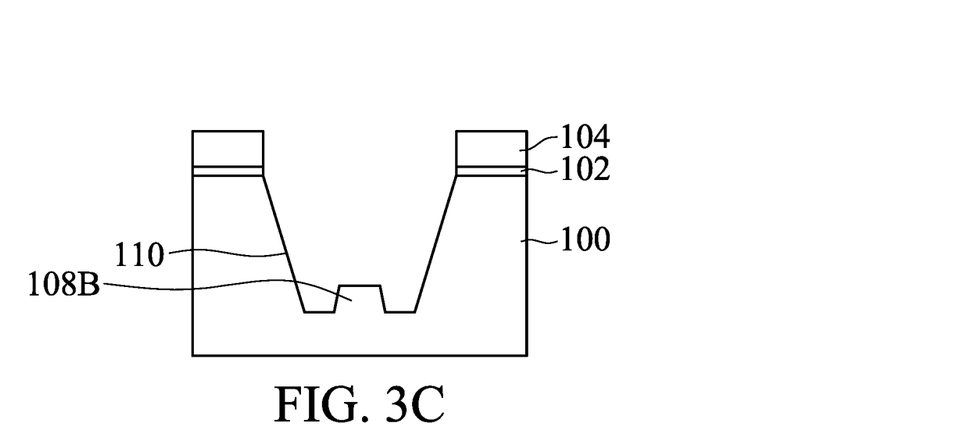

FIGS. 3A-3C are cross-sectional views of the semiconductor device at various stages of processes for reducing the needle defect according to other embodiments of the present disclosure. Compared with the embodiment shown in FIGS. 2A-2H, a single etching process is performed to remove a portion of the flowable material while reducing the height of needle defect in the embodiment shown in FIGS. 3A-3C.

The process stage shown in FIG. 3A is equivalent to the process stage shown in FIG. 2C in which the patterned mask layer 303 is formed, yet the flowable material 302 is not etched. Components and materials may refer to the embodiments described in FIGS. 2A-2C, thus it is not repeated herein.

Referring to FIG. 3B, a single etching process is performed to remove a portion of the flowable material 302 and reduce the height of the needle defect 108 at the same time using the patterned mask layer 303 as an etching mask. In an embodiment, the needle defect 108 may include silicon, and the flowable material 302 may include photoresist, ARC, SOG, or a combination thereof, and a dry etching process, a wet etching process, or a combination thereof may be used as the etching process. The etchant for the dry etching process may include, for example: chlorine-containing gas (such as $Cl_2$, $SiCl_4$ and/or $BCl_3$), bromine-containing gas (such as HBr), fluorine-containing gas (such as $CF_4$, $SF_6$, $CH_2F_2$, $CHF_3$, $NF_3$ and/or $C_2F_6$), nitrogen-containing gas (such as $N_2$), hydrogen-containing gas (such as $H_2$), oxygen-containing gas (such as $O_2$, $CO_2$, COS), or a combination thereof. The etchant for the wet etching process may include, for example, ammonium hydroxide ($NH_4OH$), hydrofluoric acid (HF), deionized water, tetramethylammonium hydroxide (TMAH), or a combination thereof.

In the embodiment shown in FIG. 3B, the ratio of the etching rate of the flowable material 302 to the etching rate of the needle defect 108 may be close to 1:1. With the low etching selectivity between the flowable material 302 and the needle defect 108, a portion of the flowable material 302 may be removed and the height of needle defect 108 may be reduced at the same time. In some embodiments, after the etching process, the height H4 of the defect 108B may be between about 50 nm and about 250 nm. In some embodiments, the ratio of the height reduction of the needle defect 108 may be between about 20% and about 80%.

Referring to FIG. 3C, after the etching process, the mask layer 303 and the flowable material 302 may be removed collectively or separately through, for example, an ash process or a wet strip process. Subsequently, the processes shown in FIGS. 2G and 2H may be referred to form the liner oxide layer and fill the trench, thus it is not repeated herein.

Through the method of the embodiment shown in FIGS. 3A-3C, the height of the trench defect of the semiconductor device can be reduced, thereby reducing the failure rate of the device. Furthermore, the number of steps in the process can be reduced due to the use of a single etching process, thereby increasing the throughput.

FIGS. 4A-4D are cross-sectional views of the semiconductor device at various stages of processes for reducing the needle defect according to yet other embodiments of the present disclosure. Compared with the embodiment shown in FIGS. 3A-3C, one etching process with low etching selectivity is performed to remove a portion of the flowable material while reducing the height of the needle defect, and another etching process with high etching selectivity is then performed to further reduce the height of the needle defect in the embodiment shown in FIGS. 4A-4D.

Figure 4A:
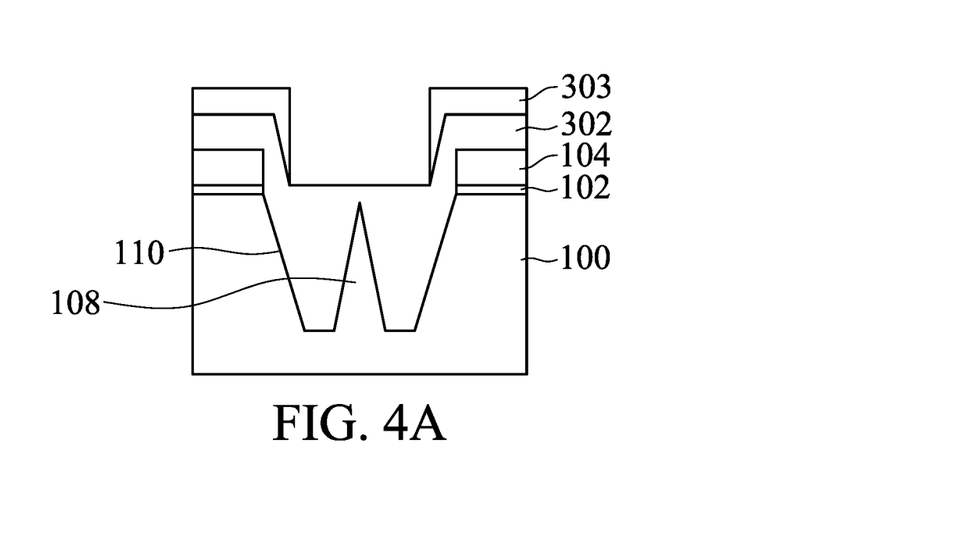
FIGS. 4A-4D are cross-sectional views of a semiconductor device at various stages of processes for reducing the needle defect according to yet other embodiments of the present disclosure.

The process stage shown in FIG. 4A is equivalent to the process stage shown in FIG. 2C in which the patterned mask layer 303 is formed, yet the flowable material 302 is not etched. Components and materials may refer to the embodiments described in FIGS. 2A-2C, thus it is not repeated herein.

Figure 4B:
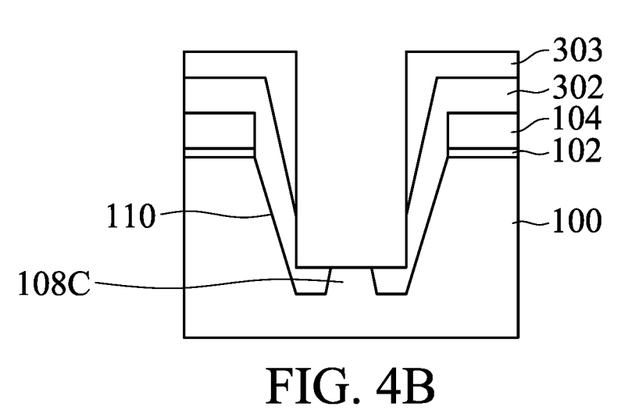

Referring to FIG. 4B, an etching process is performed to remove a portion of the flowable material 302 and reduce height of the needle defect 108 at the same time using the patterned mask layer 303 as an etching mask. The etching process of the embodiment shown in FIG. 4B may refer to the etching process of the embodiment shown in FIG. 3B, thus it is not repeated herein. In the embodiment shown in FIG. 4B, the ratio of the etching rate of the flowable material 302 to the etching rate of the needle defect 108 may be close to 1:1.

Figure 4C:
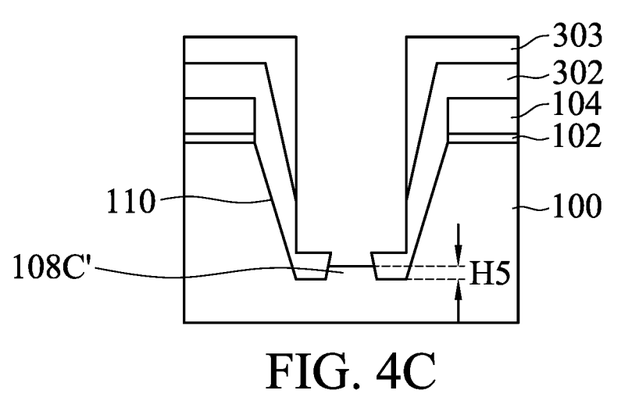

Referring to FIG. 4C, after removing a portion of the flowable material 302 and reducing the height of the needle defect 108, another etching process is performed to further reduce the height of the defect 108C. In an embodiment, the defect 108C may include silicon, and the flowable material 302 may include photoresist, ARC, SOG, or a combination thereof, and a dry etching process, a wet etching process, or a combination thereof may be used as another etching process. The etchant for the dry etching process may include, for example: chlorine-containing gas (such as $Cl_2$, $SiCl_4$ and/or $BCl_3$), bromine-containing gas (such as HBr), fluorine-containing gas (such as $CF_4$, $SF_6$, $CH_2F_2$, $CHF_3$, $NF_3$ and/or $C_2F_6$), nitrogen-containing gas (such as $N_2$), hydrogen-containing gas (such as $H_2$), oxygen-containing gas (such as $O_2$, $CO_2$, COS), or a combination thereof. The etchant for the wet etching process may include, for example, ammonium hydroxide ($NH_4OH$), hydrofluoric acid (HF), deionized water, tetramethylammonium hydroxide (TMAH), or a combination thereof.

In the embodiment shown in FIG. 4C, the ratio of the etching rate of the flowable material 302 to the etching rate of the defect 108C may be between 1:3 and 1:100, or higher in other embodiments. With the high etching selectivity between the flowable material 302 and the defect 108C, the height of the defect 108C may be further reduced without etching the flowable material 302. After another etching process, the height H5 of the defect 108C' may be between about 50 nm and about 200 nm. The ratio of the height reduction of the needle defect 108 may be between about 10% and about 60%.

Figure 4D:
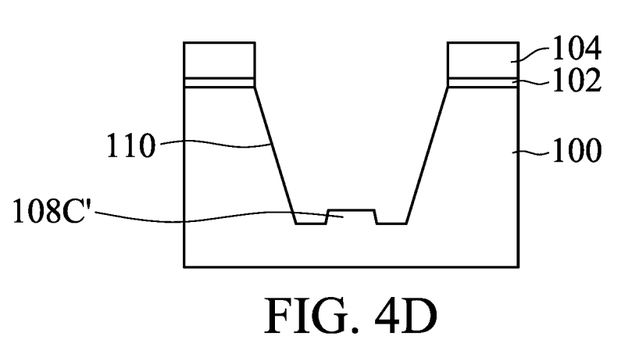

Referring to FIG. 4D, after the etching process, the mask layer 303 and the flowable material 302 may be removed collectively or separately through, for example, an ash process or a wet strip process. Subsequently, the processes shown in FIGS. 2G and 2H may be referred to form the liner oxide layer and fill the trench, thus it is not repeated herein.

Through the method of the embodiment shown in FIGS. 4A-4D, the etching process with low etching selectivity is performed to etch the flowable material and the needle defect simultaneously to improve efficiency. Then, the etching process with high etching selectivity is performed to further reduce the height of the trench defect, thereby improving the reliability of the semiconductor device.

FIGS. 5A-5D are cross-sectional views of the semiconductor device at various stages of processes for reducing the needle defect according to some embodiments of the present disclosure. Compared with the previously described embodiments, the flowable material only partially covers the needle defect in the embodiment shown in FIGS. 5A-5D.

Figure 5A:
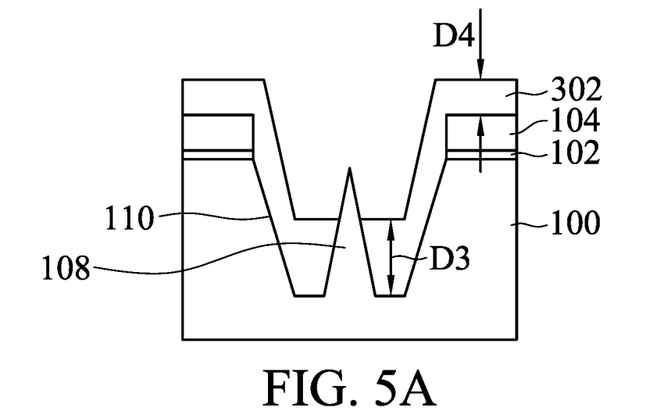
FIGS. 5A-5D are cross-sectional views of a semiconductor device at various stages of processes for reducing the needle defect according to some embodiments of the present disclosure.

Referring to FIG. 5A, after the formation of the trench with the needle defect 108, the flowable material 302 is formed on the substrate 100 to partially cover the needle defect 108. However, if an high density plasma (HDP) oxide is used, the HDP oxides will only be formed in a way that conforms to the underlying needle defect, so the effect of partially covering the needle defect cannot be achieved. As shown in FIG. 5A, the top surface of the flowable material 302 in the trench 110 is lower than the top surface of the pad layer 102. The thickness D3 of the flowable material 302 in the trench 110 is greater than the thickness D4 of the flowable material 302 outside the trench 110. The material of the flowable material 302 and method for forming the same may refer to those described above, thus it is not repeated herein.

Figure 5B:
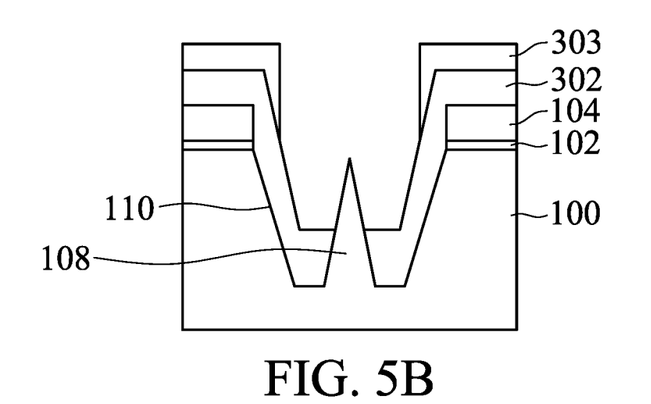

Referring to FIG. 5B, the mask layer 303 is formed on the flowable material 302. The material of the mask layer 303 and method for forming the same may refer to those described above, thus it is not repeated herein. Subsequently, the mask layer 303 is patterned to remove a portion of the mask layer 303 above the needle defect 108. The patterned mask layer 303 partially covers the flowable material 302 on the sidewalls of the trench 110.

Figure 5C:
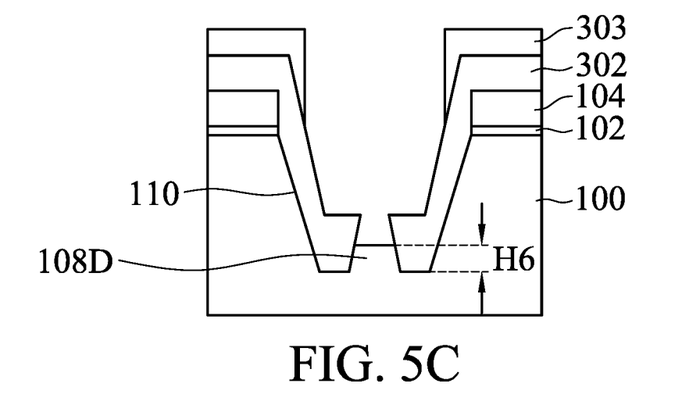

Referring to FIG. 5C, an etching process is performed to reduce the height of the needle defect 108. The etching process of the embodiment shown in FIG. 5C may refer to the etching process of the embodiment shown in FIG. 2E, thus it is not repeated herein. In the embodiment shown in FIG. 5C, the ratio of the etching rate of the flowable material 302 to the etching rate of the needle defect 108 may be between 1:3 and 1:100, or higher in other embodiments. After the etching process, the height H6 of the defect 108D may be between about 0 nm and about 200 nm. The ratio of the height reduction of the needle defect 108 may be between about 10% and about 60%.

Figure 5D:
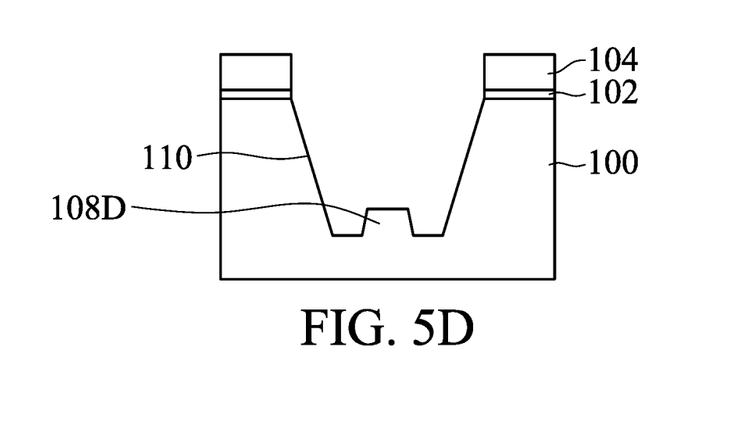

Referring to FIG. 5D, after the etching process, the mask layer 303 and the flowable material 302 may be removed collectively or separately through, for example, an ash process or a wet strip process. Subsequently, the processes shown in FIGS. 2G and 2H may be referred to form the liner oxide layer and fill the trench, thus it is not repeated herein.

Through the method of the embodiment shown in FIGS. 5A-5D, the height of the trench defect of the semiconductor device can be reduced, thereby reducing the failure rate of the device. Furthermore, compared with the embodiment in which the flowable material completely covers the needle defect, the amount of flowable material can be reduced to lower the cost and increase the throughput. In addition, the flowable material can prevent the bottom and sidewalls of the substrate from damage when using the etching process to directly reduce the height of needle defect.

Figure 6A:
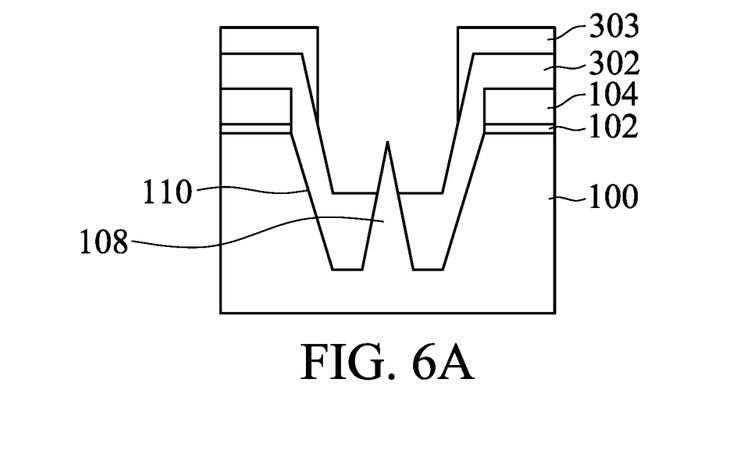
FIGS. 6A-6C are cross-sectional views of a semiconductor device at various stages of processes for reducing the needle defect according to other embodiments of the present disclosure.
Figure 6B:
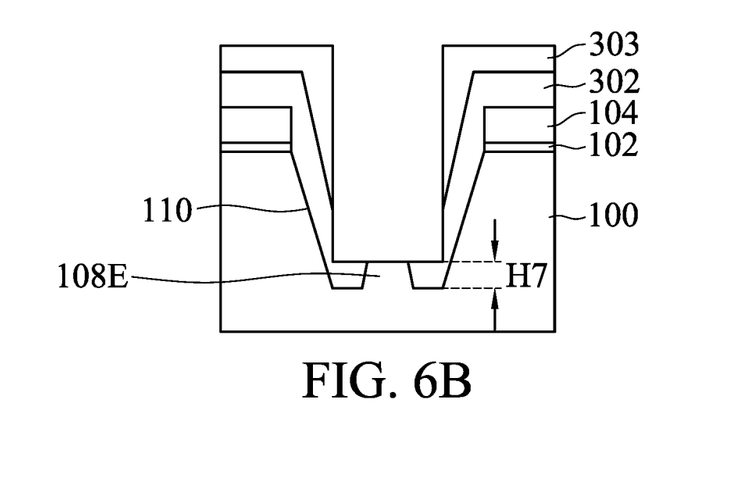
Figure 6C:
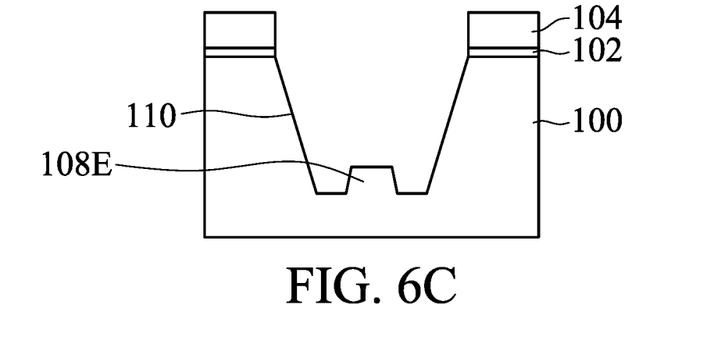

FIGS. 6A-6C are cross-sectional views of the semiconductor device at various stages of processes for reducing the needle defect according to other embodiments of the present disclosure. Compared with the embodiment shown in FIGS. 5A-5D, a single etching process is performed to remove a portion of the flowable material while reducing the height of needle defect in the embodiment shown in FIGS. 6A-6C.

The process stage shown in FIG. 6A is equivalent to the process stage shown in FIG. 5B in which the patterned mask layer 303 is formed, yet the flowable material 302 is not etched. Components and materials may refer to the embodiments described in FIGS. 5A-5B, thus it is not repeated herein.

Referring to FIG. 6B, an etching process is performed to remove a portion of the flowable material 302 and reduce the height of the needle defect 108 at the same time using the patterned mask layer 303 as an etching mask. The etching process of the embodiment shown in FIG. 6B may refer to the etching process of the embodiment shown in FIG. 3B, thus it is not repeated herein. In the embodiment shown in FIG. 6B, the ratio of the etching rate of the flowable material 302 to the etching rate of the needle defect 108 may be close to 1:1. In some embodiments, after the etching process, the height H7 of the defect 108E may be between about 50 nm and about 250 nm. The ratio of the height reduction of the needle defect 108 may be between about 20% and about 80%.

Referring to FIG. 6C, after the etching process, the mask layer 303 and the flowable material 302 may be removed collectively or separately through, for example, an ash process or a wet strip process. Subsequently, the processes shown in FIGS. 2G and 2H may be referred to form the liner oxide layer and fill the trench, thus it is not repeated herein.

Through the method of the embodiment shown in FIGS. 6A-6C, the height of the trench defect of the semiconductor device can be reduced, thereby reducing the failure rate of the device. Furthermore, the number of steps in the process can be reduced due to the use of a single etching process, thereby increasing the throughput.

FIGS. 7A-7D are cross-sectional views of the semiconductor device at various stages of processes for reducing the needle defect according to yet other embodiments of the present disclosure. Compared with the embodiment shown in FIGS. 6A-6C, one etching process with low etching selectivity is performed to remove a portion of the flowable material while reducing the height of the needle defect, and another etching process with high etching selectivity is then performed to further reduce the height of the needle defect in the embodiment shown in FIGS. 7A-7D.

Figure 7A:
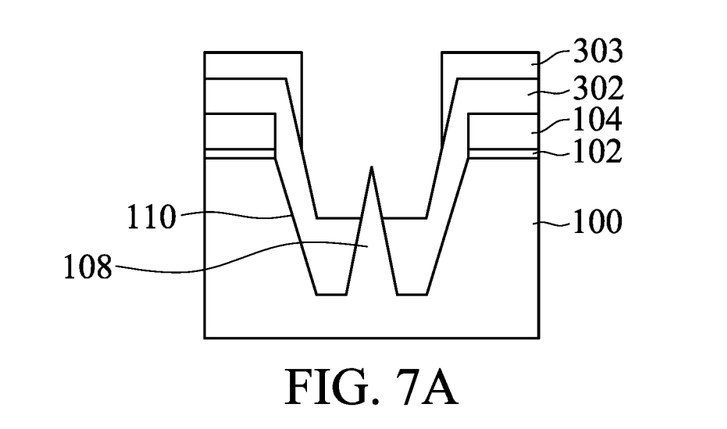
FIGS. 7A-7D are cross-sectional views of a semiconductor device at various stages of processes for reducing the needle defect according to yet other embodiments of the present disclosure.

The process stage shown in FIG. 7A is equivalent to the process stage shown in FIG. 5B in which the patterned mask layer 303 is formed, yet the flowable material 302 is not etched. Components and materials may refer to the embodiments described in FIGS. 5A-5B, thus it is not repeated herein.

Figure 7B:
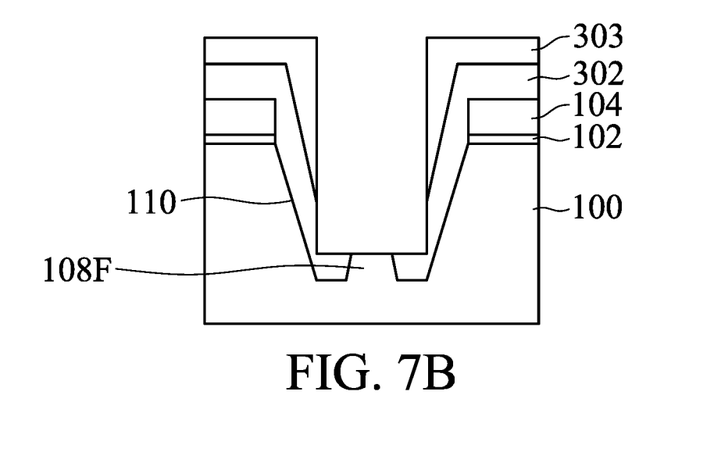

Referring to FIG. 7B, an etching process is performed to remove a portion of the flowable material 302 and reduce the height of the needle defect 108 at the same time using the patterned mask layer 303 as an etching mask. The etching process of the embodiment shown in FIG. 7B may refer to the etching process of the embodiment shown in FIG. 4B, thus it is not repeated herein. In the embodiment shown in FIG. 7B, the ratio of the etching rate of the flowable material 302 to the etching rate of the needle defect 108 may be close to 1:1.

Figure 7C:
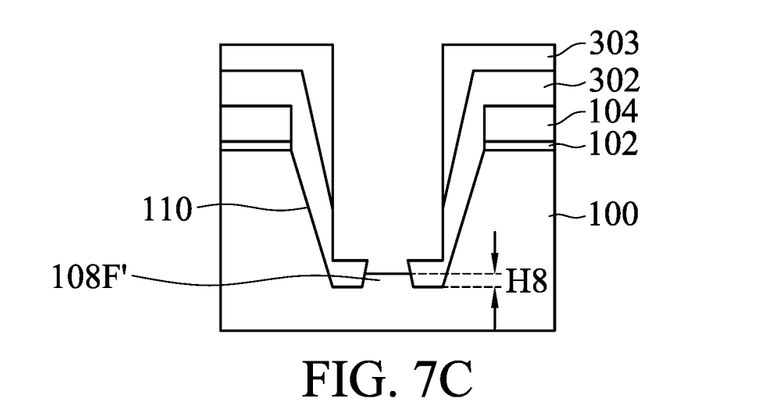

Referring to FIG. 7C, another etching process is performed to further reduce the height of the defect 108F. The etching process of the embodiment shown in FIG. 7C may refer to the etching process of the embodiment shown in FIG. 4C, thus it is not repeated herein. In the embodiment shown in FIG. 7C, the ratio of the etching rate of the flowable material 302 to the etching rate of the needle defect 108 may be between 1:3 and 1:100. After the etching process, the height H8 of the defect 108F' may be between about 0 nm and about 200 nm. The ratio of the height reduction of the needle defect 108 may be between about 10% and about 60%.

Figure 7D:
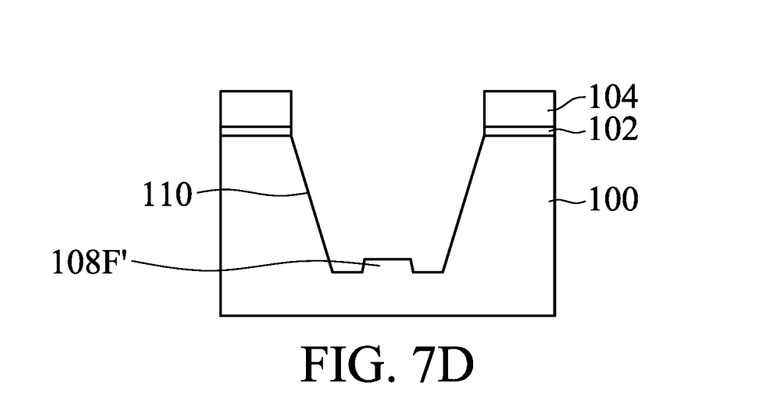

Referring to FIG. 7D, after the etching process, the mask layer 303 and the flowable material 302 may be removed collectively or separately through, for example, an ash process or a wet strip process. Subsequently, the processes shown in FIGS. 2G and 2H may be referred to form the liner oxide layer and fill the trench, thus it is not repeated herein.

Through the method of the embodiment shown in FIGS. 7A-7D, the etching process can be performed to further reduce the height of the trench defect, thereby improving the reliability of the semiconductor device.

Various embodiments of the present disclosure provide methods for forming semiconductor devices. The flowable material is formed on the defect to cover the defect in the trench, thereby having the thinner flowable material above the defect. As long as the thinner flowable material above the defect is removed to at least partially expose the defect, the height of the defect can be further reduced through etching selectivity between the flowable material and the defect such that there is an appropriate distance between the trench isolation region and the active region to avoid undesired electrical breakdown, thereby reducing the failure rate and increasing the reliability of the semiconductor device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    forming a trench in a substrate, wherein the trench comprises a defect protruding from a bottom surface of the trench;
    forming a flowable material on the substrate to partially cover the defect such that the defect protrudes from a top surface of the flowable material in the trench before performing an etching process;
    etching the defect to reduce a height of the defect; and
    removing the flowable material.

2. The method as claimed in claim 1, wherein forming the trench comprises:
    forming a pad layer on the substrate; and
    etching the pad layer and the substrate to form the trench.

3. The method as claimed in claim 2, wherein the pad layer comprises an oxide, a nitride or a combination thereof.

4. The method as claimed in claim 2, wherein a top surface of the flowable material in the trench is lower than a top surface of the pad layer.

5. The method as claimed in claim 2, wherein a top surface of the flowable material in the trench is level with a top surface of the pad layer.

6. The method as claimed in claim 1, wherein the defect comprises a needle defect, a column defect, a cone defect or a combination thereof.

7. The method as claimed in claim 1, wherein after the etching process, the height of the defect is between 100 nm and 800 nm.

8. The method as claimed in claim 1, wherein the flowable material comprises a photoresist, an anti-reflection coating (ARC), a spin on glass (SOG) or a combination thereof.

9. The method as claimed in claim 1, further comprising:
    forming a mask layer on the flowable material before the etching process; and
    patterning the mask layer, wherein the patterned mask layer partially covers the flowable material on sidewalls of the trench.

10. The method as claimed in claim 1, wherein the etching process comprises a dry etching process, a wet etching process or a combination thereof.

11. The method as claimed in claim 1, wherein a thickness of the flowable material in the trench is greater than a thickness of the flowable material outside the trench.

12. The method as claimed in claim 1, wherein performing the etching process comprises:
    performing a first etching process to remove a portion of the flowable material to expose the defect; and performing a second etching process to reduce the height of the defect.

13. The method as claimed in claim 12, wherein a ratio of an etching rate of the flowable material to an etching rate of the defect is between 3:1 and 100:1 in the first etching process.

14. The method as claimed in claim 12, wherein a ratio of an etching rate of the flowable material to an etching rate of the defect is between 1:3 and 1:100 in the second etching process.

15. The method as claimed in claim 1, wherein reducing the height of the defect and removing the flowable material are performed in a same etching process.

16. The method as claimed in claim 15, wherein a ratio of an etching rate of the flowable material to an etching rate of the defect is 1:1 in the etching process.

17. The method as claimed in claim 1, wherein performing the etching process comprises:

performing a first etching process to remove a portion of the flowable material and reduce the height of the defect; and performing a second etching process to further reduce the height of the defect.

18. The method as claimed in claim 17, wherein a ratio of an etching rate of the flowable material to an etching rate of the defect is between 3:1 and 100:1 in the first etching process.

19. The method as claimed in claim 17, wherein a ratio of an etching rate of the flowable material to an etching rate of the defect is between 1:3 and 1:100 in the second etching process.

20. The method as claimed in claim 1, wherein the etching process only reduces the height of the defect without removing the flowable material, and wherein a ratio of an etching rate of the flowable material to an etching rate of the defect is between 1:3 and 1:100 in the etching process.

* * * * *